(12) United States Patent
Hayden et al.

(10) Patent No.: US 7,761,983 B2
(45) Date of Patent: Jul. 27, 2010

(54) METHOD OF ASSEMBLING A WAFER PROBE

(75) Inventors: Leonard Hayden, Beaverton, OR (US); John Martin, Portland, OR (US); Mike Andrews, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 16 days.

(21) Appl. No.: 11/975,244

(22) Filed: Oct. 18, 2007

(65) Prior Publication Data
US 2008/0045028 A1    Feb. 21, 2008

Related U.S. Application Data

(60) Division of application No. 11/796,237, filed on Apr. 26, 2007, now Pat. No. 7,688,097, which is a continuation of application No. 09/997,501, filed on Nov. 19, 2001, now Pat. No. 7,233,160.

(60) Provisional application No. 60/251,186, filed on Dec. 4, 2000.

(51) Int. Cl.
*H01R 9/00* (2006.01)
*H05K 3/00* (2006.01)

(52) U.S. Cl. .............. 29/842; 29/827; 29/874; 324/754; 324/758

(58) Field of Classification Search .................. 29/842, 29/705, 827, 874; 324/158.1, 537, 754, 758, 324/762; 438/708, 720, 722
See application file for complete search history.

(56) References Cited

U.S. PATENT DOCUMENTS

| 491,783 | A | 2/1893 | Moyer |
| 1,337,866 | A | 4/1920 | Whitacker |
| 2,142,625 | A | 1/1939 | Zoethout |
| 2,376,101 | A | 5/1945 | Tyzzer |
| 2,389,668 | A | 11/1945 | Johnson |
| 2,545,258 | A | 3/1951 | Cailloux |
| 2,762,234 | A | 9/1952 | Dodd |
| 2,901,696 | A | 8/1959 | Möllfors |
| 2,921,276 | A | 1/1960 | Fubini |
| 2,947,939 | A | 8/1960 | Harwig |
| 3,111,699 | A | 11/1963 | Comeau |
| 3,176,091 | A | 3/1965 | Hanson et al. |
| 3,193,712 | A | 7/1965 | Harris |
| 3,218,584 | A | 11/1965 | Ayer |
| 3,230,299 | A | 1/1966 | Radziekowski |

(Continued)

FOREIGN PATENT DOCUMENTS

CH    607 045    11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Thiem Phan
(74) *Attorney, Agent, or Firm*—Chernoff, Vilhauer, McClung & Stenzel

(57) ABSTRACT

The present invention relates to a method of assembling a probe for testing of integrated circuits or other microelectronic devices.

7 Claims, 3 Drawing Sheets

U.S. PATENT DOCUMENTS

| | | |
|---|---|---|
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøoegh-Petersen |
| 4,711,563 A | 12/1987 | Lass |
| 4,713,347 A | 12/1987 | Mitchell et al. |

| | | | | | |
|---|---|---|---|---|---|
| 4,714,873 A | 12/1987 | McPherson et al. | 4,983,910 A | 1/1991 | Majidi-Ahy et al. |
| 4,725,793 A | 2/1988 | Igarashi | 4,987,100 A | 1/1991 | McBride et al. |
| 4,727,319 A | 2/1988 | Shahriary | 4,988,062 A | 1/1991 | London |
| 4,727,391 A | 2/1988 | Tajima et al. | 4,991,290 A | 2/1991 | MacKay |
| 4,727,637 A | 3/1988 | Buckwitz et al. | 4,998,062 A | 3/1991 | Ikeda |
| 4,734,641 A | 3/1988 | Byrd, Jr. et al. | 4,998,063 A | 3/1991 | Miller |
| 4,739,259 A | 4/1988 | Hadwin et al. | 5,001,423 A | 3/1991 | Abrami et al. |
| 4,740,764 A | 4/1988 | Gerlack | 5,003,253 A | 3/1991 | Majidi-Ahy et al. |
| 4,742,571 A | 5/1988 | Letron | 5,007,163 A | 4/1991 | Pope et al. |
| 4,744,041 A | 5/1988 | Strunk et al. | 5,012,186 A | 4/1991 | Gleason |
| 4,746,857 A | 5/1988 | Sakai et al. | 5,020,219 A | 6/1991 | Leedy |
| 4,749,942 A | 6/1988 | Sang et al. | 5,021,186 A | 6/1991 | Ota et al. |
| 4,754,239 A | 6/1988 | Sedivec | 5,030,907 A | 7/1991 | Yih et al. |
| 4,755,742 A | 7/1988 | Mallory et al. | 5,041,782 A | 8/1991 | Marzan |
| 4,755,746 A | 7/1988 | Mallory et al. | 5,045,781 A | 9/1991 | Gleason et al. |
| 4,755,747 A | 7/1988 | Sato | 5,059,898 A | 10/1991 | Barsotti et al. |
| 4,755,872 A | 7/1988 | Esrig et al. | 5,061,192 A | 10/1991 | Chapin et al. |
| 4,755,874 A | 7/1988 | Esrig et al. | 5,061,823 A | 10/1991 | Carroll |
| 4,757,255 A | 7/1988 | Margozzi | 5,066,357 A | 11/1991 | Smyth, Jr. et al. |
| 4,764,723 A | 8/1988 | Strid | 5,069,628 A | 12/1991 | Crumly |
| 4,766,384 A | 8/1988 | Kleinberg et al. | 5,082,627 A | 1/1992 | Stanbro |
| 4,772,846 A | 9/1988 | Reeds | 5,084,671 A | 1/1992 | Miyata et al. |
| 4,780,670 A | 10/1988 | Cherry | 5,089,774 A | 2/1992 | Nakano |
| 4,783,625 A | 11/1988 | Harry et al. | 5,091,692 A | 2/1992 | Ohno et al. |
| 4,788,851 A | 12/1988 | Brault | 5,091,732 A | 2/1992 | Mileski et al. |
| 4,791,363 A | 12/1988 | Logan | 5,095,891 A | 3/1992 | Reitter |
| 4,793,814 A | 12/1988 | Zifcak et al. | 5,097,101 A | 3/1992 | Trobough |
| 4,795,962 A | 1/1989 | Yanagawa et al. | 5,097,207 A | 3/1992 | Blanz |
| 4,805,627 A | 2/1989 | Klingenbeck et al. | 5,101,453 A | 3/1992 | Rumbaugh |
| 4,810,981 A | 3/1989 | Herstein | 5,107,076 A | 4/1992 | Bullock et al. |
| 4,812,754 A | 3/1989 | Tracy et al. | 5,116,180 A | 5/1992 | Fung et al. |
| 4,818,059 A | 4/1989 | Kakii et al. | 5,126,286 A | 6/1992 | Chance |
| 4,827,211 A | 5/1989 | Strid et al. | 5,126,696 A | 6/1992 | Grote et al. |
| 4,831,494 A | 5/1989 | Arnold et al. | 5,128,612 A | 7/1992 | Aton et al. |
| 4,835,495 A | 5/1989 | Simonutti | 5,129,006 A | 7/1992 | Hill |
| 4,837,507 A | 6/1989 | Hechtman | 5,133,119 A | 7/1992 | Afshari et al. |
| 4,839,587 A | 6/1989 | Flatley et al. | 5,134,365 A | 7/1992 | Okubo et al. |
| 4,849,689 A | 7/1989 | Gleason et al. | 5,136,237 A | 8/1992 | Smith et al. |
| 4,851,767 A | 7/1989 | Halbout et al. | 5,138,289 A | 8/1992 | McGrath |
| 4,853,624 A | 8/1989 | Rabjohn | 5,142,224 A | 8/1992 | Smith et al. |
| 4,853,627 A | 8/1989 | Gleason et al. | 5,145,552 A | 9/1992 | Yoshizawa et al. |
| 4,858,160 A | 8/1989 | Strid et al. | 5,148,131 A | 9/1992 | Amboss et al. |
| 4,859,989 A | 8/1989 | McPherson | 5,159,264 A | 10/1992 | Anderson |
| 4,864,227 A | 9/1989 | Sato | 5,159,267 A | 10/1992 | Anderson |
| 4,871,883 A | 10/1989 | Guiol | 5,159,752 A | 11/1992 | Mahant-Shetti et al. |
| 4,871,964 A | 10/1989 | Boll et al. | 5,160,883 A | 11/1992 | Blanz |
| 4,888,550 A | 12/1989 | Reid | 5,164,319 A | 11/1992 | Hafeman et al. |
| 4,891,584 A | 1/1990 | Kamieniecki et al. | 5,166,606 A | 11/1992 | Blanz |
| 4,893,914 A | 1/1990 | Hancock et al. | 5,170,930 A | 12/1992 | Dolbear et al. |
| 4,894,612 A | 1/1990 | Drake et al. | 5,172,049 A | 12/1992 | Kiyokawa et al. |
| 4,899,126 A | 2/1990 | Yamada | 5,172,050 A | 12/1992 | Swapp |
| 4,899,998 A | 2/1990 | Feramachi | 5,172,051 A | 12/1992 | Zamborelli |
| 4,901,012 A | 2/1990 | Gloanec et al. | 5,177,438 A | 1/1993 | Littlebury et al. |
| 4,904,933 A | 2/1990 | Snyder et al. | 5,180,977 A | 1/1993 | Huff |
| 4,904,935 A | 2/1990 | Calma et al. | 5,187,443 A | 2/1993 | Bereskin |
| 4,906,920 A | 3/1990 | Huff et al. | 5,198,752 A | 3/1993 | Miyata et al. |
| 4,908,570 A | 3/1990 | Gupta et al. | 5,198,753 A | 3/1993 | Hamburgen |
| 4,912,399 A | 3/1990 | Greub et al. | 5,202,558 A | 4/1993 | Barker |
| 4,916,002 A | 4/1990 | Carver | 5,202,648 A | 4/1993 | McCandless |
| 4,916,398 A | 4/1990 | Rath | 5,207,585 A | 5/1993 | Byrnes et al. |
| 4,918,373 A | 4/1990 | Newberg | 5,214,243 A | 5/1993 | Johnson |
| 4,918,383 A | 4/1990 | Huff et al. | 5,214,374 A | 5/1993 | St. Onge |
| 4,922,128 A | 5/1990 | Dhong et al. | 5,225,037 A | 7/1993 | Elder et al. |
| 4,922,186 A | 5/1990 | Tsuchiya et al. | 5,227,730 A | 7/1993 | King et al. |
| 4,922,912 A | 5/1990 | Watanabe | 5,232,789 A | 8/1993 | Platz et al. |
| 4,926,172 A | 5/1990 | Gorsek | 5,233,197 A | 8/1993 | Bowman et al. |
| 4,929,893 A | 5/1990 | Sato et al. | 5,233,306 A | 8/1993 | Misra |
| 4,965,514 A | 10/1990 | Herrick | 5,245,292 A | 9/1993 | Milesky et al. |
| 4,970,386 A | 11/1990 | Buck | 5,266,889 A | 11/1993 | Harwood et al. |
| 4,972,073 A | 11/1990 | Lessing | 5,266,963 A | 11/1993 | Carter |
| 4,975,638 A | 12/1990 | Evans et al. | 5,267,088 A | 11/1993 | Nomura |
| 4,980,637 A | 12/1990 | Huff et al. | 5,270,664 A | 12/1993 | McMurty et al. |
| 4,980,638 A | 12/1990 | Dermon et al. | 5,274,336 A | 12/1993 | Crook et al. |

| | | | | | |
|---|---|---|---|---|---|
| 5,280,156 A | 1/1994 | Niori et al. | 5,530,372 A | 6/1996 | Lee et al. |
| 5,281,364 A | 1/1994 | Stirling et al. | 5,531,022 A | 7/1996 | Beaman et al. |
| 5,289,117 A | 2/1994 | Van Loan et al. | 5,532,608 A | 7/1996 | Behfar-Rad et al. |
| 5,293,175 A | 3/1994 | Hemmie et al. | 5,537,372 A | 7/1996 | Albrecht et al. |
| 5,298,972 A | 3/1994 | Heffner | 5,539,323 A | 7/1996 | Davis, Jr. |
| 5,304,924 A | 4/1994 | Yamano et al. | 5,539,676 A | 7/1996 | Yamaguchi |
| 5,308,250 A | 5/1994 | Walz | 5,550,481 A | 8/1996 | Holmes et al. |
| 5,313,157 A | 5/1994 | Pasiecznik, Jr. | 5,561,378 A | 10/1996 | Bockelman et al. |
| 5,315,237 A | 5/1994 | Iwakura et al. | 5,565,788 A | 10/1996 | Burr et al. |
| 5,316,435 A | 5/1994 | Monzingo | 5,565,881 A | 10/1996 | Phillips et al. |
| 5,317,656 A | 5/1994 | Moslehi et al. | 5,569,591 A | 10/1996 | Kell et al. |
| 5,321,352 A | 6/1994 | Takebuchi | 5,571,324 A | 11/1996 | Sago et al. |
| 5,321,453 A | 6/1994 | Mori et al. | 5,578,932 A | 11/1996 | Adamian |
| 5,326,412 A | 7/1994 | Schreiber et al. | 5,583,445 A | 12/1996 | Mullen |
| 5,334,931 A | 8/1994 | Clarke et al. | 5,584,120 A | 12/1996 | Roberts |
| 5,347,204 A | 9/1994 | Gregory et al. | 5,584,608 A | 12/1996 | Gillespie |
| 5,355,079 A | 10/1994 | Evans et al. | 5,589,781 A | 12/1996 | Higgens et al. |
| 5,357,211 A | 10/1994 | Bryson et al. | 5,594,358 A | 1/1997 | Ishikawa et al. |
| 5,360,312 A | 11/1994 | Mozingo | 5,600,256 A | 2/1997 | Woith et al. |
| 5,361,049 A | 11/1994 | Rubin et al. | 5,601,740 A | 2/1997 | Eldridge et al. |
| 5,363,050 A | 11/1994 | Guo et al. | 5,610,529 A | 3/1997 | Schwindt |
| 5,367,165 A | 11/1994 | Toda et al. | 5,611,008 A | 3/1997 | Yap |
| 5,369,368 A | 11/1994 | Kassen et al. | 5,617,035 A | 4/1997 | Swapp |
| 5,371,654 A | 12/1994 | Beaman et al. | 5,621,333 A | 4/1997 | Long et al. |
| 5,373,231 A | 12/1994 | Boll et al. | 5,621,400 A | 4/1997 | Corbi |
| 5,374,938 A | 12/1994 | Hatazawa et al. | 5,623,213 A | 4/1997 | Liu et al. |
| 5,376,790 A | 12/1994 | Linker et al. | 5,623,214 A | 4/1997 | Pasiecznik, Jr. |
| 5,383,787 A | 1/1995 | Switky et al. | 5,627,473 A | 5/1997 | Takami |
| 5,389,885 A | 2/1995 | Swart | 5,628,057 A | 5/1997 | Phillips et al. |
| 5,395,253 A | 3/1995 | Crumly | 5,629,838 A | 5/1997 | Knight et al. |
| 5,397,855 A | 3/1995 | Ferlier | 5,631,571 A | 5/1997 | Spaziani et al. |
| 5,404,111 A | 4/1995 | Mori et al. | 5,633,780 A | 5/1997 | Cronin |
| 5,408,188 A | 4/1995 | Katoh | 5,635,846 A | 6/1997 | Beaman et al. |
| 5,408,189 A | 4/1995 | Swart et al. | 5,642,298 A | 6/1997 | Mallory et al. |
| 5,412,330 A | 5/1995 | Ravel et al. | 5,644,248 A | 7/1997 | Fujimoto |
| 5,412,866 A | 5/1995 | Woith et al. | 5,653,939 A | 8/1997 | Hollis et al. |
| 5,414,565 A | 5/1995 | Sullivan et al. | 5,656,942 A | 8/1997 | Watts et al. |
| 5,422,574 A | 6/1995 | Kister | 5,659,421 A | 8/1997 | Rahmel et al. |
| 5,430,813 A | 7/1995 | Anderson et al. | 5,666,063 A | 9/1997 | Abercrombie et al. |
| 5,441,690 A | 8/1995 | Ayala-Esquilin et al. | 5,669,316 A | 9/1997 | Faz et al. |
| 5,451,884 A | 9/1995 | Sauerland | 5,670,322 A | 9/1997 | Eggers et al. |
| 5,453,404 A | 9/1995 | Leedy | 5,670,888 A | 9/1997 | Cheng |
| 5,457,398 A | 10/1995 | Schwindt et al. | 5,672,816 A | 9/1997 | Park et al. |
| 5,463,324 A | 10/1995 | Wardwell et al. | 5,675,499 A | 10/1997 | Lee et al. |
| 5,467,024 A | 11/1995 | Swapp | 5,675,932 A | 10/1997 | Mauney |
| 5,469,324 A | 11/1995 | Henderson et al. | 5,676,360 A | 10/1997 | Boucher et al. |
| 5,471,185 A | 11/1995 | Shea et al. | 5,678,210 A | 10/1997 | Hannah |
| 5,475,316 A | 12/1995 | Hurley et al. | 5,685,232 A | 11/1997 | Inoue |
| 5,476,211 A | 12/1995 | Khandros | 5,686,317 A | 11/1997 | Akram et al. |
| 5,477,011 A | 12/1995 | Singles et al. | 5,686,960 A | 11/1997 | Sussman et al. |
| 5,478,748 A | 12/1995 | Akins, Jr. et al. | 5,688,618 A | 11/1997 | Hulderman et al. |
| 5,479,108 A | 12/1995 | Cheng | 5,700,844 A | 12/1997 | Hederick et al. |
| 5,479,109 A | 12/1995 | Lau et al. | 5,704,355 A | 1/1998 | Bridges |
| 5,481,196 A | 1/1996 | Nosov | 5,715,819 A | 2/1998 | Svenson et al. |
| 5,481,936 A | 1/1996 | Yanagisawa | 5,720,098 A | 2/1998 | Kister |
| 5,487,999 A | 1/1996 | Farnworth | 5,723,347 A | 3/1998 | Kirano et al. |
| 5,488,954 A | 2/1996 | Sleva et al. | 5,726,211 A | 3/1998 | Hedrick et al. |
| 5,491,425 A | 2/1996 | Watanabe et al. | 5,728,091 A | 3/1998 | Payne et al. |
| 5,493,070 A | 2/1996 | Habu | 5,729,150 A | 3/1998 | Schwindt |
| 5,493,236 A | 2/1996 | Ishii et al. | 5,731,920 A | 3/1998 | Katsuragawa |
| 5,500,606 A | 3/1996 | Holmes | 5,742,174 A | 4/1998 | Kister et al. |
| 5,505,150 A | 4/1996 | James et al. | 5,744,971 A | 4/1998 | Chan et al. |
| 5,506,498 A | 4/1996 | Anderson et al. | 5,748,506 A | 5/1998 | Bockelman |
| 5,506,515 A | 4/1996 | Godshalk et al. | 5,751,153 A | 5/1998 | Bockelman |
| 5,507,652 A | 4/1996 | Wardwell | 5,751,252 A | 5/1998 | Phillips |
| 5,510,792 A | 4/1996 | Ono et al. | 5,756,021 A | 5/1998 | Bedrick et al. |
| 5,511,010 A | 4/1996 | Burns | 5,756,908 A | 5/1998 | Knollmeyer et al. |
| 5,512,835 A | 4/1996 | Rivera et al. | 5,764,070 A | 6/1998 | Pedder |
| 5,517,126 A | 5/1996 | Yamaguchi | 5,767,690 A | 6/1998 | Fujimoto |
| 5,521,518 A | 5/1996 | Higgins | 5,772,451 A | 6/1998 | Dozier, II et al. |
| 5,521,522 A | 5/1996 | Abe et al. | 5,773,780 A | 6/1998 | Eldridge et al. |
| 5,523,694 A | 6/1996 | Cole, Jr. | 5,777,485 A | 7/1998 | Tanaka et al. |
| 5,528,158 A | 6/1996 | Sinsheimer et al. | 5,785,538 A | 7/1998 | Beaman et al. |

| | | | | | |
|---|---|---|---|---|---|
| 5,792,668 A | 8/1998 | Fuller et al. | 5,983,493 A | 11/1999 | Eldridge et al. |
| 5,793,213 A | 8/1998 | Bockelman et al. | 5,993,611 A | 11/1999 | Moroney, III et al. |
| 5,794,133 A | 8/1998 | Kashima | 5,994,152 A | 11/1999 | Khandros et al. |
| 5,803,607 A | 9/1998 | Jones et al. | 5,995,914 A | 11/1999 | Cabot |
| 5,804,607 A | 9/1998 | Hedrick et al. | 5,996,102 A | 11/1999 | Haulin |
| 5,804,982 A | 9/1998 | Lo et al. | 5,998,228 A | 12/1999 | Eldridge et al. |
| 5,804,983 A | 9/1998 | Nakajima et al. | 5,998,768 A | 12/1999 | Hunter et al. |
| 5,806,181 A | 9/1998 | Khandros et al. | 5,998,864 A | 12/1999 | Khandros et al. |
| 5,807,107 A | 9/1998 | Bright et al. | 5,999,268 A | 12/1999 | Yonezawa et al. |
| 5,808,874 A | 9/1998 | Smith | 6,001,760 A | 12/1999 | Katsuda et al. |
| 5,810,607 A | 9/1998 | Shih et al. | 6,002,426 A | 12/1999 | Back et al. |
| 5,811,751 A | 9/1998 | Leona et al. | 6,006,002 A | 12/1999 | Motok et al. |
| 5,811,982 A | 9/1998 | Beaman et al. | 6,013,586 A | 1/2000 | McGhee et al. |
| 5,813,847 A | 9/1998 | Eroglu et al. | 6,019,612 A | 2/2000 | Hasegawa et al. |
| 5,814,847 A | 9/1998 | Shihadeh et al. | 6,023,103 A | 2/2000 | Chang et al. |
| 5,820,014 A | 10/1998 | Dozier, II et al. | 6,028,435 A | 2/2000 | Nikawa |
| 5,821,763 A | 10/1998 | Beaman et al. | 6,029,344 A | 2/2000 | Khandros et al. |
| 5,824,494 A | 10/1998 | Feldberg | 6,031,383 A | 2/2000 | Streib et al. |
| 5,829,128 A | 11/1998 | Eldridge et al. | 6,032,356 A | 3/2000 | Eldridge et al. |
| 5,829,437 A | 11/1998 | Bridges | 6,032,714 A | 3/2000 | Fenton |
| 5,831,442 A | 11/1998 | Heigl | 6,033,935 A | 3/2000 | Dozier, II et al. |
| 5,832,601 A | 11/1998 | Eldridge et al. | 6,034,533 A | 3/2000 | Tervo et al. |
| 5,833,601 A | 11/1998 | Swartz et al. | 6,037,785 A | 3/2000 | Higgins |
| 5,838,160 A | 11/1998 | Beaman et al. | 6,040,739 A | 3/2000 | Wedeen et al. |
| 5,841,288 A | 11/1998 | Meaney et al. | 6,042,712 A | 3/2000 | Mathieu |
| 5,841,342 A | 11/1998 | Hegmann et al. | 6,043,563 A | 3/2000 | Eldridge et al. |
| 5,846,708 A | 12/1998 | Hollis et al. | 6,046,599 A | 4/2000 | Long et al. |
| 5,847,569 A | 12/1998 | Ho et al. | 6,049,216 A | 4/2000 | Yang et al. |
| 5,848,500 A | 12/1998 | Kirk | 6,049,976 A | 4/2000 | Khandros |
| 5,852,232 A | 12/1998 | Samsavar et al. | 6,050,829 A | 4/2000 | Eldridge et al. |
| 5,852,871 A | 12/1998 | Khandros | 6,051,422 A | 4/2000 | Kovacs et al. |
| 5,854,608 A | 12/1998 | Leisten | 6,052,653 A | 4/2000 | Mazur et al. |
| 5,864,946 A | 2/1999 | Eldridge et al. | 6,054,651 A | 4/2000 | Fogel et al. |
| 5,867,073 A | 2/1999 | Weinreb et al. | 6,054,869 A | 4/2000 | Hutton et al. |
| 5,869,326 A | 2/1999 | Hofmann | 6,059,982 A | 5/2000 | Palagonia et al. |
| 5,869,974 A | 2/1999 | Akram et al. | 6,060,888 A | 5/2000 | Blackham et al. |
| 5,874,361 A | 2/1999 | Collins et al. | 6,060,892 A | 5/2000 | Yamagata |
| 5,876,082 A | 3/1999 | Kempf et al. | 6,061,589 A | 5/2000 | Bridges et al. |
| 5,878,486 A | 3/1999 | Eldridge et al. | 6,062,879 A | 5/2000 | Beaman et al. |
| 5,879,289 A | 3/1999 | Yarush et al. | 6,064,213 A | 5/2000 | Khandros et al. |
| 5,883,522 A | 3/1999 | O'Boyle | 6,064,217 A | 5/2000 | Smith |
| 5,883,523 A | 3/1999 | Ferland et al. | 6,064,218 A | 5/2000 | Godfrey et al. |
| 5,884,398 A | 3/1999 | Eldridge et al. | 6,066,911 A | 5/2000 | Lindemann et al. |
| 5,888,075 A | 3/1999 | Hasegawa et al. | 6,071,009 A | 6/2000 | Clyne |
| 5,892,539 A | 4/1999 | Colvin | 6,078,183 A | 6/2000 | Cole, Jr. |
| 5,896,038 A | 4/1999 | Budnaitis et al. | 6,078,500 A | 6/2000 | Beaman et al. |
| 5,900,737 A | 5/1999 | Graham et al. | 6,090,261 A | 7/2000 | Mathieu |
| 5,900,738 A | 5/1999 | Khandros et al. | 6,091,236 A | 7/2000 | Piety et al. |
| 5,903,143 A | 5/1999 | Mochizuki et al. | 6,091,255 A | 7/2000 | Godfrey |
| 5,905,421 A | 5/1999 | Oldfield | 6,091,256 A | 7/2000 | Long et al. |
| 5,910,727 A | 6/1999 | Fujihara et al. | 6,096,561 A | 8/2000 | Kaplan et al. |
| 5,912,046 A | 6/1999 | Eldridge et al. | 6,096,567 A | 8/2000 | Kaplan et al. |
| 5,914,613 A | 6/1999 | Gleason et al. | 6,100,815 A | 8/2000 | Pailthorp |
| 5,914,614 A | 6/1999 | Beaman et al. | 6,104,201 A | 8/2000 | Beaman et al. |
| 5,916,689 A | 6/1999 | Collins et al. | 6,104,206 A | 8/2000 | Verkull |
| 5,917,707 A | 6/1999 | Khandros et al. | 6,110,823 A | 8/2000 | Eldridge et al. |
| 5,923,180 A | 7/1999 | Botka et al. | 6,114,864 A | 9/2000 | Soejima et al. |
| 5,926,029 A | 7/1999 | Ference et al. | 6,114,865 A | 9/2000 | Lagowski et al. |
| 5,926,951 A | 7/1999 | Khandros et al. | 6,118,287 A | 9/2000 | Boll et al. |
| 5,940,965 A | 8/1999 | Uhling et al. | 6,118,894 A | 9/2000 | Schwartz et al. |
| 5,944,093 A | 8/1999 | Viswanath | 6,121,836 A | 9/2000 | Vallencourt |
| 5,945,836 A | 8/1999 | Sayre et al. | 6,124,725 A | 9/2000 | Sato |
| 5,949,383 A | 9/1999 | Hayes et al. | 6,127,831 A | 10/2000 | Khoury et al. |
| 5,949,579 A | 9/1999 | Baker | 6,130,536 A | 10/2000 | Powell et al. |
| 5,959,461 A | 9/1999 | Brown et al. | 6,137,302 A | 10/2000 | Schwindt |
| 5,963,364 A | 10/1999 | Leong et al. | 6,144,212 A | 11/2000 | Mizuta |
| 5,966,645 A | 10/1999 | Davis | 6,146,908 A | 11/2000 | Falque et al. |
| 5,970,429 A | 10/1999 | Martin | 6,147,502 A | 11/2000 | Fryer et al. |
| 5,973,504 A | 10/1999 | Chong | 6,147,851 A | 11/2000 | Anderson |
| 5,974,662 A | 11/1999 | Eldridge et al. | 6,150,186 A | 11/2000 | Chen et al. |
| 5,977,783 A | 11/1999 | Takayama et al. | 6,160,407 A | 12/2000 | Nikawa |
| 5,981,268 A | 11/1999 | Kovacs et al. | 6,166,553 A | 12/2000 | Sinsheimer |
| 5,982,166 A | 11/1999 | Mautz | 6,168,974 B1 | 1/2001 | Chang et al. |

| Patent | Date | Inventor |
|---|---|---|
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,201,453 B1 | 3/2001 | Chan et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,257,565 B1 | 7/2001 | Avneri et al. |
| 6,259,260 B1 | 7/2001 | Smith et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penney et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |

| | | | |
|---|---|---|---|
| 6,580,283 B1 | 6/2003 | Carbone et al. | |
| 6,582,979 B2 | 6/2003 | Coccioli et al. | |
| 6,587,327 B1 | 7/2003 | Devoe et al. | |
| 6,597,187 B2 | 7/2003 | Eldridge et al. | |
| 6,603,322 B1 | 8/2003 | Boll et al. | |
| 6,603,323 B1 | 8/2003 | Miller et al. | |
| 6,603,324 B2 | 8/2003 | Eldridge et al. | |
| 6,605,941 B2 | 8/2003 | Abe | |
| 6,605,951 B1 | 8/2003 | Cowan | |
| 6,605,955 B1 | 8/2003 | Costello et al. | |
| 6,606,014 B2 | 8/2003 | Miller | |
| 6,606,575 B2 | 8/2003 | Miller | |
| 6,608,494 B1 | 8/2003 | Bruce et al. | |
| 6,611,417 B2 | 8/2003 | Chen | |
| 6,615,485 B2 | 9/2003 | Eldridge et al. | |
| 6,616,966 B2 | 9/2003 | Mathieu et al. | |
| 6,617,862 B1 | 9/2003 | Bruce | |
| 6,617,866 B1 | 9/2003 | Ickes | |
| 6,621,082 B2 | 9/2003 | Morita et al. | |
| 6,621,260 B2 | 9/2003 | Eldridge et al. | |
| 6,622,103 B1 | 9/2003 | Miller | |
| 6,624,648 B2 | 9/2003 | Eldridge et al. | |
| 6,627,461 B2 | 9/2003 | Chapman et al. | |
| 6,627,483 B2 | 9/2003 | Ondricek et al. | |
| 6,627,980 B2 | 9/2003 | Eldridge | |
| 6,628,503 B2 | 9/2003 | Sogard | |
| 6,628,980 B2 | 9/2003 | Atalar et al. | |
| 6,633,174 B1 | 10/2003 | Satya et al. | |
| 6,636,182 B2 | 10/2003 | Mehltretter | |
| 6,639,461 B1 | 10/2003 | Tam et al. | |
| 6,640,415 B2 | 11/2003 | Eslamy et al. | |
| 6,640,432 B1 | 11/2003 | Mathieu et al. | |
| 6,642,625 B2 | 11/2003 | Dozier, II et al. | |
| 6,643,597 B1 | 11/2003 | Dunsmore | |
| 6,644,982 B1 | 11/2003 | Ondricek et al. | |
| 6,646,520 B2 | 11/2003 | Miller | |
| 6,653,903 B2 | 11/2003 | Leich et al. | |
| 6,655,023 B1 | 12/2003 | Eldridge et al. | |
| 6,657,455 B2 | 12/2003 | Eldridge et al. | |
| 6,657,601 B2 | 12/2003 | McLean | |
| 6,661,316 B2 | 12/2003 | Hreish et al. | |
| 6,664,628 B2 | 12/2003 | Khandros et al. | |
| 6,669,489 B1 | 12/2003 | Dozier, II et al. | |
| 6,672,875 B1 | 1/2004 | Mathieu et al. | |
| 6,677,744 B1 | 1/2004 | Long | |
| 6,678,850 B2 | 1/2004 | Roy et al. | |
| 6,678,876 B2 | 1/2004 | Stevens et al. | |
| 6,680,659 B2 | 1/2004 | Miller | |
| 6,685,817 B1 | 2/2004 | Mathieu | |
| 6,686,754 B2 | 2/2004 | Miller | |
| 6,690,185 B1 | 2/2004 | Khandros et al. | |
| 6,701,265 B2 | 3/2004 | Hill et al. | |
| 6,701,612 B2 | 3/2004 | Khandros et al. | |
| 6,707,548 B2 | 3/2004 | Kreimer et al. | |
| 6,708,403 B2 | 3/2004 | Beaman et al. | |
| 6,710,798 B1 | 3/2004 | Hershel et al. | |
| 6,713,374 B2 | 3/2004 | Eldridge et al. | |
| 6,714,828 B2 | 3/2004 | Eldridge et al. | |
| 6,717,426 B2 | 4/2004 | Iwasaki | |
| 6,720,501 B1 | 4/2004 | Henson | |
| 6,722,032 B2 | 4/2004 | Beaman et al. | |
| 6,724,205 B1 | 4/2004 | Hayden et al. | |
| 6,724,928 B1 | 4/2004 | Davis | |
| 6,727,579 B1 | 4/2004 | Eldridge et al. | |
| 6,727,580 B1 | 4/2004 | Eldridge et al. | |
| 6,727,716 B1 | 4/2004 | Sharif | |
| 6,729,019 B2 | 5/2004 | Grube et al. | |
| 6,731,804 B1 | 5/2004 | Carrieri et al. | |
| 6,734,687 B1 | 5/2004 | Ishitani et al. | |
| 6,737,920 B2 | 5/2004 | Jen et al. | |
| 6,741,085 B1 | 5/2004 | Khandros et al. | |
| 6,741,092 B2 | 5/2004 | Eldridge et al. | |
| 6,741,129 B1 | 5/2004 | Corsi et al. | |
| 6,744,268 B2 | 6/2004 | Hollman | |
| 6,753,679 B1 | 6/2004 | Kwong et al. | |
| 6,753,699 B2 | 6/2004 | Stockstad | |
| 6,759,311 B2 | 7/2004 | Eldridge et al. | |
| 6,759,859 B2 | 7/2004 | Deng et al. | |
| 6,764,869 B2 | 7/2004 | Eldridge et al. | |
| 6,768,328 B2 | 7/2004 | Self et al. | |
| 6,770,955 B1 | 8/2004 | Coccioli et al. | |
| 6,771,806 B1 | 8/2004 | Satya et al. | |
| 6,777,319 B2 | 8/2004 | Grube et al. | |
| 6,778,140 B1 | 8/2004 | Yeh | |
| 6,778,406 B2 | 8/2004 | Eldridge et al. | |
| 6,780,001 B2 | 8/2004 | Eldridge et al. | |
| 6,784,674 B2 | 8/2004 | Miller | |
| 6,784,677 B2 | 8/2004 | Miller | |
| 6,784,679 B2 | 8/2004 | Sweet et al. | |
| 6,788,093 B2 | 9/2004 | Aitren et al. | |
| 6,788,094 B2 | 9/2004 | Khandros et al. | |
| 6,791,176 B2 | 9/2004 | Mathieu et al. | |
| 6,794,888 B2 | 9/2004 | Kawaguchi et al. | |
| 6,794,934 B2 | 9/2004 | Betti-Berutto et al. | |
| 6,794,950 B2 | 9/2004 | Du Toit et al. | |
| 6,798,225 B2 | 9/2004 | Miller | |
| 6,798,226 B2 | 9/2004 | Altmann et al. | |
| 6,806,724 B2 | 10/2004 | Hayden et al. | |
| 6,806,836 B2 | 10/2004 | Ogawa et al. | |
| 6,807,734 B2 | 10/2004 | Eldridge et al. | |
| 6,809,533 B1 | 10/2004 | Anlage et al. | |
| 6,811,406 B2 | 11/2004 | Grube | |
| 6,812,691 B2 | 11/2004 | Miller | |
| 6,812,718 B1 | 11/2004 | Chong et al. | |
| 6,815,963 B2 | 11/2004 | Gleason et al. | |
| 6,816,031 B1 | 11/2004 | Miller | |
| 6,816,840 B1 | 11/2004 | Goodwin, III | |
| 6,817,052 B2 | 11/2004 | Grube | |
| 6,818,840 B2 | 11/2004 | Khandros | |
| 6,822,463 B1 | 11/2004 | Jacobs | |
| 6,822,529 B2 | 11/2004 | Miller | |
| 6,825,052 B2 | 11/2004 | Eldridge et al. | |
| 6,825,422 B2 | 11/2004 | Eldridge et al. | |
| 6,827,582 B2 | 12/2004 | Mathieu et al. | |
| 6,827,584 B2 | 12/2004 | Mathieu et al. | |
| 6,835,898 B2 | 12/2004 | Eldridge et al. | |
| 6,836,962 B2 | 1/2005 | Khandros et al. | |
| 6,838,885 B2 | 1/2005 | Kamitani | |
| 6,838,893 B2 | 1/2005 | Khandros et al. | |
| 6,839,964 B2 | 1/2005 | Henson | |
| 6,845,491 B2 | 1/2005 | Miller et al. | |
| 6,850,082 B2 | 2/2005 | Schwindt | |
| 6,856,129 B2 | 2/2005 | Thomas et al. | |
| 6,856,150 B2 | 2/2005 | Sporck et al. | |
| 6,862,727 B2 | 3/2005 | Stevens | |
| 6,864,105 B2 | 3/2005 | Grube et al. | |
| 6,864,694 B2 | 3/2005 | McTigue | |
| 6,870,359 B1 | 3/2005 | Sekel | |
| 6,870,381 B2 | 3/2005 | Grube | |
| 6,882,239 B2 | 4/2005 | Miller | |
| 6,882,546 B2 | 4/2005 | Miller | |
| 6,887,723 B1 | 5/2005 | Ondricek et al. | |
| 6,888,362 B2 | 5/2005 | Eldridge et al. | |
| 6,891,385 B2 | 5/2005 | Miller | |
| 6,900,646 B2 | 5/2005 | Kasukabe et al. | |
| 6,900,647 B2 | 5/2005 | Yoshida et al. | |
| 6,900,652 B2 | 5/2005 | Mazur | |
| 6,900,653 B2 | 5/2005 | Yu et al. | |
| 6,902,416 B2 | 6/2005 | Feldman | |
| 6,902,941 B2 | 6/2005 | Sun | |
| 6,903,563 B2 | 6/2005 | Yoshida et al. | |
| 6,906,506 B1 | 6/2005 | Reano et al. | |
| 6,906,539 B2 | 6/2005 | Wilson et al. | |
| 6,906,542 B2 | 6/2005 | Sakagawa et al. | |
| 6,906,543 B2 | 6/2005 | Lou et al. | |
| 6,907,149 B2 | 6/2005 | Slater | |

| | | |
|---|---|---|
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,375 B2 | 9/2005 | Karavakis et al. |
| 6,946,859 B2 | 9/2005 | Karavakis et al. |
| 6,946,860 B2 | 9/2005 | Cheng et al. |
| 6,946,864 B2 | 9/2005 | Gramann et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,328 B1 | 4/2006 | Beerling |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,057,404 B2 | 6/2006 | Gleason et al. |
| 7,071,722 B2 | 7/2006 | Yamada et al. |
| 7,088,981 B2 | 8/2006 | Chang |
| 7,096,133 B1 | 8/2006 | Martin et al. |
| 7,161,363 B2 | 1/2007 | Gleason et al. |
| 7,173,433 B2 | 2/2007 | Hoshi et al. |
| 7,187,188 B2 | 3/2007 | Andrews et al. |
| 7,188,037 B2 | 3/2007 | Hidehira |
| 7,219,416 B2 | 5/2007 | Inoue et al. |
| 7,233,160 B2 | 6/2007 | Hayden et al. |
| 7,253,646 B2 | 8/2007 | Lou et al. |
| 7,271,603 B2 | 9/2007 | Gleason et al. |
| 7,276,922 B2 | 10/2007 | Miller et al. |
| 7,315,175 B2 | 1/2008 | Cole |
| 7,319,335 B2 | 1/2008 | Brunner et al. |
| 7,319,337 B2 | 1/2008 | Sakata |
| 7,323,680 B2 | 1/2008 | Chong |
| 7,323,899 B2 | 1/2008 | Schuette et al. |
| 7,327,153 B2 | 2/2008 | Weinraub |
| 7,332,918 B2 | 2/2008 | Sugiyama et al. |
| 7,332,923 B2 | 2/2008 | Schott et al. |
| 7,342,402 B2 | 3/2008 | Kim et al. |
| 7,403,028 B2 | 7/2008 | Campbell |
| 7,427,868 B2 | 9/2008 | Strid et al. |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0030480 A1 | 3/2002 | Appen et al. |
| 2002/0050828 A1 | 5/2002 | Seward, IV et al. |

| | | | | | |
|---|---|---|---|---|---|
| 2002/0070743 A1 | 6/2002 | Felici et al. | 2005/0151548 A1 | 7/2005 | Hayden et al. |
| 2002/0070745 A1 | 6/2002 | Johnson et al. | 2005/0156675 A1 | 7/2005 | Rohde et al. |
| 2002/0079911 A1 | 6/2002 | Schwindt | 2005/0164160 A1 | 7/2005 | Gunter et al. |
| 2002/0105396 A1 | 8/2002 | Streeter et al. | 2005/0165316 A1 | 7/2005 | Lowery et al. |
| 2002/0109088 A1 | 8/2002 | Nara et al. | 2005/0168722 A1 | 8/2005 | Forstner et al. |
| 2002/0118034 A1 | 8/2002 | Laureanti | 2005/0172703 A1 | 8/2005 | Kley |
| 2002/0149377 A1 | 10/2002 | Hefti et al. | 2005/0174191 A1 | 8/2005 | Brunker et al. |
| 2002/0153909 A1 | 10/2002 | Petersen et al. | 2005/0178980 A1 | 8/2005 | Skidmore et al. |
| 2002/0163769 A1 | 11/2002 | Brown | 2005/0179444 A1 | 8/2005 | Tiemeijer |
| 2002/0168659 A1 | 11/2002 | Hefti et al. | 2005/0184742 A1 | 8/2005 | Huang et al. |
| 2002/0176160 A1 | 11/2002 | Suzuki et al. | 2005/0195124 A1 | 9/2005 | Puente Baliarda et al. |
| 2002/0180466 A1 | 12/2002 | Hiramatsu et al. | 2005/0229053 A1 | 10/2005 | Sunter |
| 2002/0197709 A1 | 12/2002 | van der Weide et al. | 2005/0236587 A1 | 10/2005 | Kodama et al. |
| 2003/0010877 A1 | 1/2003 | Landreville et al. | 2005/0237102 A1 | 10/2005 | Tanaka |
| 2003/0030822 A1 | 2/2003 | Finarov | 2006/0030060 A1 | 2/2006 | Noguchi et al. |
| 2003/0032000 A1 | 2/2003 | Liu et al. | 2006/0052075 A1 | 3/2006 | Galivanche et al. |
| 2003/0040004 A1 | 2/2003 | Hefti et al. | 2006/0155270 A1 | 7/2006 | Hancock et al. |
| 2003/0057513 A1 | 3/2003 | Leedy | 2006/0184041 A1 | 8/2006 | Andrews et al. |
| 2003/0062915 A1 | 4/2003 | Arnold et al. | 2006/0220663 A1 | 10/2006 | Oikawa |
| 2003/0072549 A1 | 4/2003 | Facer et al. | 2006/0226864 A1 | 10/2006 | Kramer |
| 2003/0076585 A1 | 4/2003 | Ledley | 2007/0024506 A1 | 2/2007 | Hardacker |
| 2003/0077649 A1 | 4/2003 | Cho et al. | 2007/0030021 A1 | 2/2007 | Cowan et al. |
| 2003/0088180 A1 | 5/2003 | Van Veen et al. | 2007/0145989 A1 | 6/2007 | Zhu et al. |
| 2003/0119057 A1 | 6/2003 | Gascoyne et al. | 2008/0111571 A1 | 5/2008 | Smith et al. |
| 2003/0139662 A1 | 7/2003 | Seidman | | | |
| 2003/0139790 A1 | 7/2003 | Ingle et al. | | | |
| 2003/0155939 A1 | 8/2003 | Lutz et al. | | | |

FOREIGN PATENT DOCUMENTS

| | | | | | |
|---|---|---|---|---|---|
| 2003/0170898 A1 | 9/2003 | Gunderson et al. | CN | 1083975 | 3/1994 |
| 2003/0184332 A1 | 10/2003 | Tomimatsu et al. | DE | 2951072 | 7/1981 |
| 2003/0215966 A1 | 11/2003 | Rolda et al. | DE | 3426565 | 1/1986 |
| 2003/0234659 A1 | 12/2003 | Zieleman | DE | 3637549 | 5/1988 |
| 2004/0015060 A1 | 1/2004 | Samsoondar et al. | DE | 288234 | 3/1991 |
| 2004/0021475 A1 | 2/2004 | Ito et al. | DE | 4223658 | 1/1993 |
| 2004/0029425 A1 | 2/2004 | Yean et al. | DE | 9313420 | 10/1993 |
| 2004/0061514 A1 | 4/2004 | Schwindt et al. | DE | 19522774 | 1/1997 |
| 2004/0066181 A1 | 4/2004 | Theis | DE | 19542955 | 5/1997 |
| 2004/0069776 A1 | 4/2004 | Fagrell et al. | DE | 19618717 | 1/1998 |
| 2004/0090223 A1 | 5/2004 | Yonezawa | DE | 19749687 | 5/1998 |
| 2004/0095145 A1 | 5/2004 | Boudiaf et al. | DE | 29809568 | 10/1998 |
| 2004/0095641 A1 | 5/2004 | Russum et al. | DE | 10000324 | 7/2001 |
| 2004/0100276 A1 | 5/2004 | Fanton | DE | 20220754 | 5/2004 |
| 2004/0100297 A1 | 5/2004 | Tanioka et al. | EP | 0230766 | 12/1985 |
| 2004/0108847 A1 | 6/2004 | Stoll et al. | EP | 0195520 | 9/1986 |
| 2004/0113640 A1 | 6/2004 | Cooper et al. | EP | 0230348 | 7/1987 |
| 2004/0130787 A1 | 7/2004 | Thome-Forster et al. | EP | 0259163 | 3/1988 |
| 2004/0132222 A1 | 7/2004 | Hembree et al. | EP | 0259183 | 3/1988 |
| 2004/0134899 A1 | 7/2004 | Hiramatsu et al. | EP | 0259942 | 3/1988 |
| 2004/0140819 A1 | 7/2004 | McTigue et al. | EP | 0261986 | 3/1988 |
| 2004/0147034 A1 | 7/2004 | Gore et al. | EP | 0270422 | 6/1988 |
| 2004/0162689 A1 | 8/2004 | Jamneala et al. | EP | 0333521 | 9/1989 |
| 2004/0170312 A1 | 9/2004 | Soenksen | EP | 0460911 | 12/1991 |
| 2004/0175294 A1 | 9/2004 | Ellison et al. | EP | 0846476 | 10/1998 |
| 2004/0186382 A1 | 9/2004 | Modell et al. | EP | 0945736 | 9/1999 |
| 2004/0193382 A1 | 9/2004 | Adamian et al. | GB | 579665 | 8/1946 |
| 2004/0197771 A1 | 10/2004 | Powers et al. | GB | 2014315 | 8/1979 |
| 2004/0199350 A1 | 10/2004 | Blackham et al. | GB | 2179458 | 3/1987 |
| 2004/0201388 A1 | 10/2004 | Barr | JP | 52-19046 | 2/1977 |
| 2004/0207072 A1 | 10/2004 | Hiramatsu et al. | JP | 53-037077 | 4/1978 |
| 2004/0207424 A1 | 10/2004 | Hollman | JP | 53037077 | 4/1978 |
| 2004/0239338 A1 | 12/2004 | Johnsson et al. | JP | 53-052354 | 5/1978 |
| 2004/0246004 A1 | 12/2004 | Heuermann | JP | 55-115383 | 9/1980 |
| 2004/0251922 A1 | 12/2004 | Martens et al. | JP | 55115383 | 9/1980 |
| 2005/0024069 A1 | 2/2005 | Hayden et al. | JP | 56-007439 | 1/1981 |
| 2005/0026276 A1 | 2/2005 | Chou | JP | 56-88333 | 7/1981 |
| 2005/0030047 A1 | 2/2005 | Adamian | JP | 5691503 | 7/1981 |
| 2005/0054029 A1 | 3/2005 | Tomimatsu et al. | JP | 56088333 | 7/1981 |
| 2005/0062533 A1 | 3/2005 | Vice | JP | 57-075480 | 5/1982 |
| 2005/0068054 A1 | 3/2005 | Mok et al. | JP | 57075480 | 5/1982 |
| 2005/0083130 A1 | 4/2005 | Grilo | JP | 57-163035 | 10/1982 |
| 2005/0088191 A1 | 4/2005 | Lesher | JP | 57163035 | 10/1982 |
| 2005/0101846 A1 | 5/2005 | Fine et al. | JP | 57171805 | 10/1982 |
| 2005/0116730 A1 | 6/2005 | Hsu | JP | 58-130602 | 8/1983 |
| 2005/0142033 A1 | 6/2005 | Glezer et al. | JP | 594189 U | 1/1984 |

| | | |
|---|---|---|
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327032 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF) Software," MT950D Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplanar Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W- Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

The Micromanipulator Company, data sheet, Double Sided Probing System, Jul. 2002, 2 pages.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "Insight overview, From genomics to proteomics," Nature, vol. 422, Mar. 13, 2003, pp. 193-197.

Andrej Sali, Robert Glaeser, Thomas Earnest, and Wolfgang Baumeister, "Insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R.N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New Concept in Microwave Measurements: Theory and Experimental Verification," IEEE Transactions on Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rose, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

Bob Stengel, "Neutralized Differential Amplifiers using Mixed-Mode s-parameters," 2003 IEEE Radio Frequency Integrated Circuits Symposium, pp. 711-714.

METHOD OF ASSEMBLING A WAFER PROBE

CROSS-REFERENCE TO RELATED APPLICATIONS

This application is a division of U.S. patent application Ser. No. 11/796,237, filed Apr. 26, 2007, now U.S Pat. No. 7,688,097, which is a continuation of U.S. patent application Ser. No. 09/997,501, filed Nov. 19, 2001 now U.S. Pat. No. 7,233,160, which application claims the benefit of U.S. Provisional App. No. 60/251,186, filed Dec. 4, 2000.

BACKGROUND OF THE INVENTION

The present invention relates to a probe for testing of integrated circuits or other microelectronic devices.

One type of probe utilizes a spaced-apart array of slender needles to contact pads on a device under test (DUT). A signal is provided to the DUT, and the voltages and/or currents at the selected nodes are routed to measurement equipment. A problem encountered with such measurement systems, particularly at high frequencies, is that the close proximity between the needle tips creates inductance that can interfere with accurate measurements. Though this inductance can be reduced by limiting the isolated portion of the probe tips to the region immediately surrounding the DUT, practical considerations make such a design difficult.

Probe structures have been developed to compensate for the inductance at the probe tips. One such design is exemplified by Lockwood et al., U.S. Pat. No. 4,697,143. Lockwood et al. disclose a ground-signal-ground arrangement of strip like conductive traces formed on the underside of an alumina substrate so as to create coplanar transmission lines. These coplanar transmission lines extend from the pads of the DUT at one end to a coaxial cable at the other end. The associated pair of ground traces on each coplanar transmission line is connected to the outer conductor of the coaxial cable and the interposed signal trace is connected to the inner conductor. Areas of wear-resistant conductive material are provided to reliably establish an electrical connection with the respective pads of the DUT. Layers of ferrite-containing microwave absorbing material are mounted about the substrate to absorb spurious microwave energy over a major portion of the length of each ground-signal-ground trace pattern. In accordance with this type of construction, a high frequency impedance (e.g., 50 ohms) can be presented at the probe tips to the device under test. Thus broadband signals of eighteen gigahertz or less can travel with little loss across the coplanar transmission lines formed by each ground-signal-ground trace pattern.

The probing system of Lockwood et al., however, is insufficient to effectively probe non-planar surfaces. Such surfaces might result, for example, if the pads of the DUT differ in height, if a loose metallic particle of minute dimension adheres electrostatically to the surface of one of the pads of the DUT so as to form a non-planar surface irregularity, or when the plane of the DUT is inadvertently tilted slightly with respect to the plane of the coplanar tips of the probing assembly. Further, proper alignment between the needles and the DUT requires careful placement of each needle, a time consuming process.

The alignment limitation between the needles was addressed by Godshalk, U.S. Pat. No. 5,506,515. Godshalk discloses a ground-signal-ground finger arrangement attached to a coaxial cable, as in Lockwood. The fingers, however, are originally formed in one piece, joined together by a carrier tab at the contact ends. Once the fingers are attached to the coaxial cable, the carrier tab is severed and the contact fingers appropriately shaped for contact with the DUT. Godshalk discloses that the relative position of each finger is held in alignment first by the carrying tab, and then by the coaxial cable. Unfortunately, Godshalk's design is limited in that the close placement of a coaxial cable to the finely spaced geometry of the DUT places a limit on the number of coaxial cables, and hence contact fingers, that may be used effectively in the probe. Further, a probe having multiple adjacent coaxial cables, each of which has different flexibilities, may lead to insufficient contact with some of the nodes on the DUT.

Another class of probes that provide clean power to circuits at low impedance are generally referred to as power bypass probes. Another configuration that has been developed to counteract the inductance at the tips of a probe assembly is a power bypass quadrant. The power bypass quadrant minimizes such inductance by providing integrated capacitors or resistor-capacitor networks within the probe.

Strid, U.S. Pat. No. 4,764,723, discloses a power bypass quadrant probe that utilizes an array of ceramic fingers coated with a thin gold or polyimide film to make contact with the DUT. The test signals are routed through a power bypass structure consisting of an RC network. Because of the small geometries near the DUT, the capacitors are located far away from the probe tip, which potentially decreases performance. In addition, the ceramic contact fingers tend to break during probing, particularly when the probe overshoots the contact pads. Further, probing pads that are not coplanar is exceedingly difficult because the ceramic contacting fingers lack flexibility.

Boll et al., U.S. Pat. No. 5,373,231 disclose a probe that includes an array of blades to contact the pads of a DUT. The array of blades extend from a transmission line network traced on a circuit board. An RC network is provided on the circuit board to provide the requisite power bypass, and in some instances, flexible capacitors are located close to, or between the contact blades. Because of the limited geometries near the DUT, the capacitance of the capacitors interconnected between the blades are small, and alone are insufficient to adequately eliminate circuit inductance. Accordingly, a second bank of capacitors with larger values are located away from the probe tip where space is available. Probes utilizing flexible capacitors between the closely spaced blades of the probe have proven to be of limited mechanical durability.

What is desired, therefore, is a configurable, multi-contact probe for high frequency testing of integrated circuits or other microelectronic devices that reduces the inductance at the probe tip to levels acceptable for measurement over a wide range of frequencies. The probe should be sufficiently durable and flexible to reliably and repeatedly probe substantially non-planar devices over time. It is further desired that the probe be easily aligned with the contact points on the device to be tested and that the probe be capable of simultaneously probing a number of such contact points.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 1:
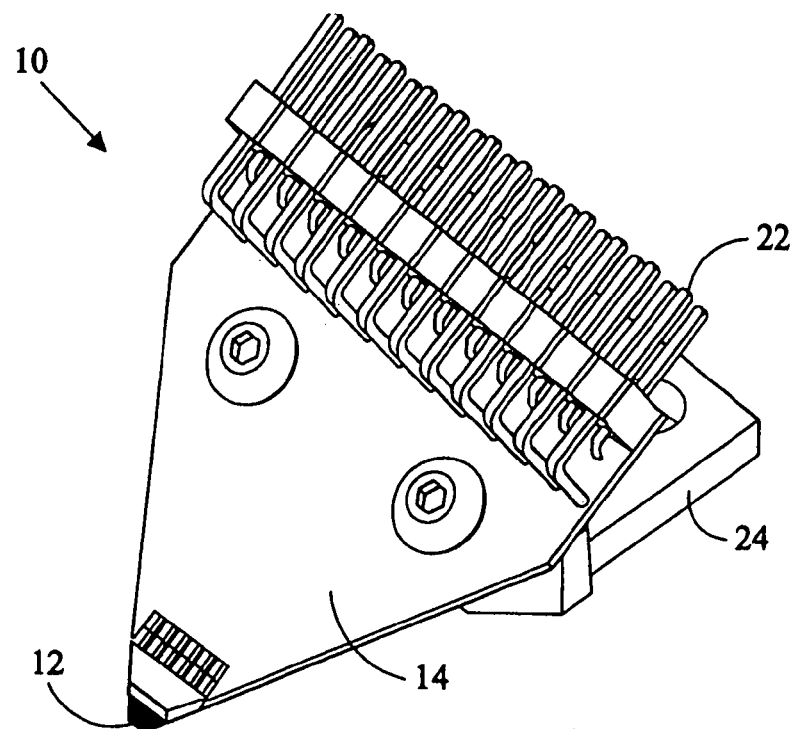
FIG. 1 shows a top view of an exemplary embodiment of the probe head of the present invention.
Figure 2:
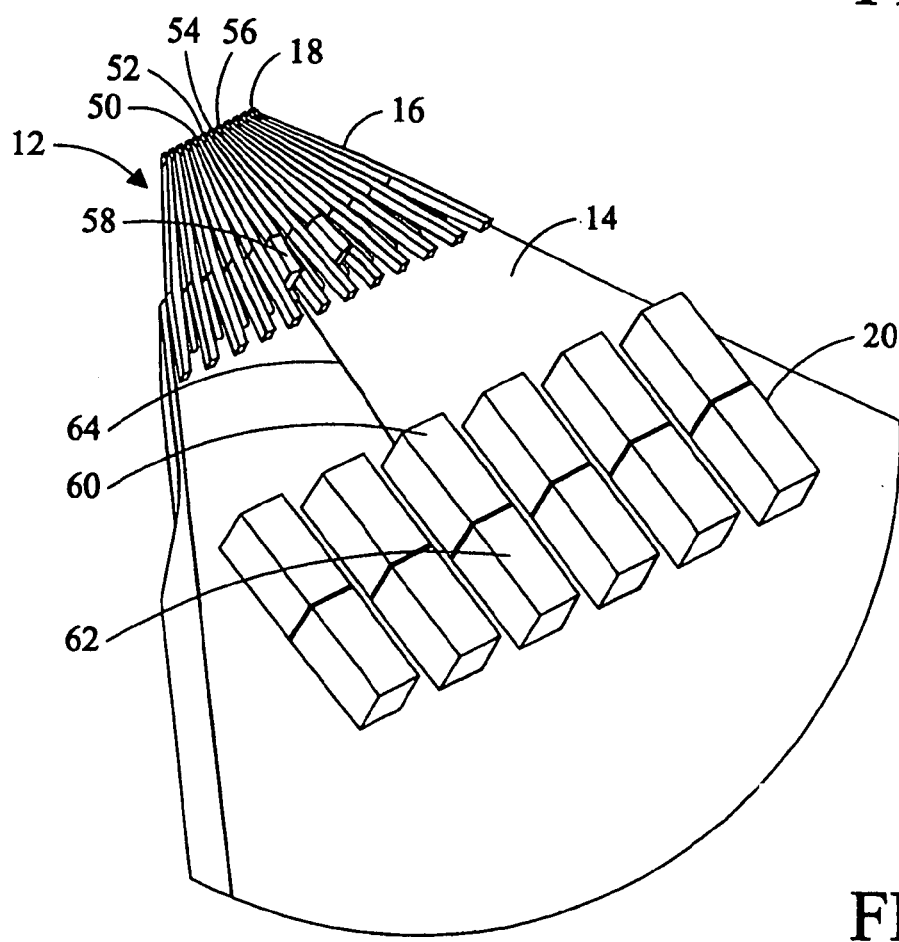
FIG. 2 shows a bottom view, at an enlarged scale, of the probe head of FIG. 1.

FIGS. 1 and 2 illustrate an exemplary wafer probe 10. The wafer probe 10 includes an integrated tip assembly 12 mounted to a circuit board 14. The integrated tip assembly 12 comprises a plurality of contact fingers 16 extending from the circuit board 14 in a radially inward direction so as to match the compact geometry of the device under test (not shown). The distal end portion 17 of each contact finger is shaped to provide a reliable electrical connection with an associated pad on a device under test. The circuit board 14 has electrical traces that route signals from the contact fingers 16 through a resistor-capacitor (RC) network 20 to pin connectors 22. Measurement cables (not shown) may be electrically connected to the pin connectors.

The wafer probe 10 is designed to be mounted on a support through a three hole mounting frame 24 of a wafer probe station so as to be in a suitable position for probing a device under test, such as an individual component on a semiconductor wafer. In this type of application, the wafer is typically supported under vacuum pressure on the upper surface of a chuck that is part of the same probing station. Ordinarily an X-Y-Z positioning mechanism is provided, such as a micrometer knob assembly, to effect movement between the supporting member and the chuck so that the tip assembly of the wafer probe can be brought into pressing engagement with the contact pads of the device under test.

Figure 3:
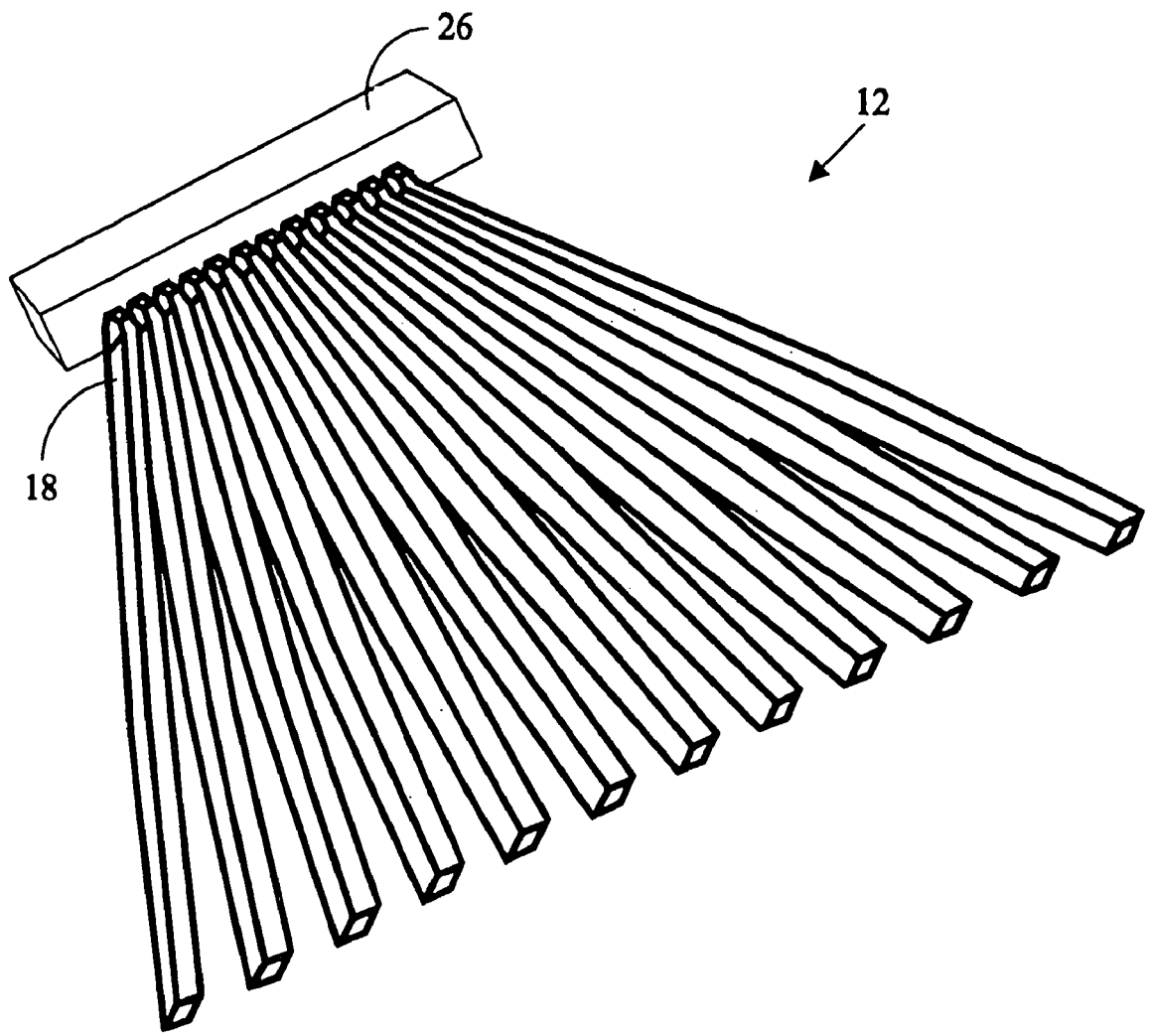
FIG. 3 shows an enlarged view of the probe tips attached to a common carrying tab of the probe head of FIG. 1.

Referring to FIG. 3, the integrated tip assembly 12 is fashioned as a unitary device with the individual contact fingers 16 connected by a common carrying tab 26 at the probing end. Each individual contact finger 16 is positioned so that, after the integrated tip assembly 12 is attached the circuit board 14, the common carrying tab 26 may be severed, leaving the distal end 18 of each contact finger in the appropriate position for probing the contact pads of the device under test.

The spacing of the contact fingers 16 at their respective distal ends 18 is selected to match the geometry of the DUT pads. Use of an integrated tip assembly 12 advantageously serves to maintain this proper spacing while the contact fingers 16 are attached to their respective connections to the circuit board 14. Typically, contact fingers or needles are attached to a circuit board by being held flush to their respective traces and soldered into the appropriate position and pitch. During this process, lateral forces tend to displace the distal ends of the contact fingers, making it difficult to maintain the proper spatial relationship between the contact fingers to match that of the pads of the DUT. Use of a carrying tab 26, however, maintains the proper transverse spacing of the distal ends 18 of the contact fingers 16 by counteracting any lateral forces encountered in the attachment process.

In addition, the probe 16 described herein achieves an improved spatial transformation between the compact geometry of the microelectronic device being probed and the dispersed geometry of the testing equipment and, if provided, any power bypass circuitry. This improved spatial characteristic stands in contrast to earlier design, in which signals were routed through a coaxial cable. A coaxial cable, having simply an inner and an outer conductor, limits the number of attached contact fingers to three, arranged in a ground-signal-ground arrangement. Accordingly, any common carrying tab used to hold the contact fingers in position during their attachment to a coaxial cable also is limited to a maximum of three contact fingers.

Oftentimes, however, the DUT has more than three pads to be tested. In such a case, configuring the probe requires the use of multiple coaxial cables arranged in an adjacent relationship to each other, usually an awkward process given the limited space available near the probe tips. Use of multiple coaxial cables is also problematical in that different cables have differing flexibility, making it difficult to line up all the cables in a single plane and leading to uneven probe forces when the contact fingers are pressed to their respective pads. Moreover, the used of multiple coaxial cables and multiple carrying tabs necessitates the careful and time consuming adjustment of the relative position between the sets of contact fingers to the geometry of the pads of the DUT. In another design, the use of multiple coaxial cables and a single carrying tab necessitates the careful and time consuming adjustment of the relative position of the coaxial cables.

Use of a circuit board 14, however, addresses each of these drawbacks. Because the circuit board 14 can include separate traces for each of the contact pads of the DUT to which the probe will be engaged during testing, the common carrying tab 26 depicted in FIG. 3 may include four or more contact fingers 16, maintaining all of their respective distal ends in their proper position until each finger 16 is rigidly attached to the circuit board 14. The circuit board 14 provides a controlled and uniform flexure, assuring not only a uniform amount of overtravel when the fingers 16 make contact with the pads of the DUT, but also a mechanism by which the stress in the contact fingers 16 may be relieved by the uniform flexibility of the circuit board 14. This flexibility may even be controlled by the selection of material for the circuit board 14.

FIG. 3 shows an example of an integrated tip assembly having the common carrying tab 26 still attached. The fingers 16 are generally of rectangular cross section and are preferably composed of the same material, where the material is selected from those metals that are capable of high resiliency to enable the fingers to probe a device having associated contact surfaces that are in non-planar arrangement. In the preferred embodiment, the fingers are formed of beryllium-copper (BeCu) which has been gold plated in order to reduce resistive losses. This material is particularly suited for the probing of contact pads that are formed of gold, since BeCu is substantially harder than gold. This, in turn, results in minimal wear and a long, maintenance free period of operation of the probe.

If the pads of the device are formed of aluminum instead of gold, it is preferable to use a harder material for the fingers 16, such as tungsten. Here again, the finger material selected is substantially harder than the contact pad material in order to ensure minimal wearing of the fingers 16. If tungsten fingers are used, it is preferable that they also be gold plated to reduce resistive losses. Use of materials such as BeCu and tungsten allows repeated use of the probe while avoiding the fragility encountered through the use of the ceramic contact fingers described earlier. It should also be noted that other potential materials may be used, in addition to BeCu or tungsten. In addition, a number of other potential techniques exist to connect the contact fingers with the circuit board besides soldering, including epoxy and the like.

The contact fingers 16 are fabricated as a single, integrated unit attached to a common carrying tab 26 at the distal (tip) ends 18. The distal end 18 has a shape that provides a geometrical fanning of the contacts from the very small pitch (center-to center contact spacing) at the distal ends 18 up to the larger geometry of the traces 40 on the circuit board 14.

In accordance with one preferred assembly method, to prepare for connection of the respective contact fingers to the circuit board, solder paste is evenly applied to the exposed traces on the circuit board. The fingers are then held just above their corresponding traces, then lowered until they press against the solder paste in an appropriate position. When the solder is melted, preferably by heating elements arranged above and below the connection region a solder fillet is desirably formed between each finger and its corresponding circuit board trace.

Preferably, while heating the solder, the fingers are held at a slight downward incline relative to the distal ends so that during cooling, each finger assumes a planar relationship with the circuit board 14. During this connection process, it will be noted that the proper transverse spacing is maintained between the respective fingers by the common carrier tab since any forces that would tend to laterally displace the fingers are negated by the common carrier tab 26 that holds the contact fingers at their respective distal ends. 18 After the fingers 16 are attached to the circuit board 14, the common carrier tab 26 is severed as it is no longer needed because proper finger alignment is maintained by the circuit board 14. The fingers 16 are preferably shaped using grinding and lapping processes to create a flat contact area whose leading edge is visible when viewed from directly above.

Figure 4A:
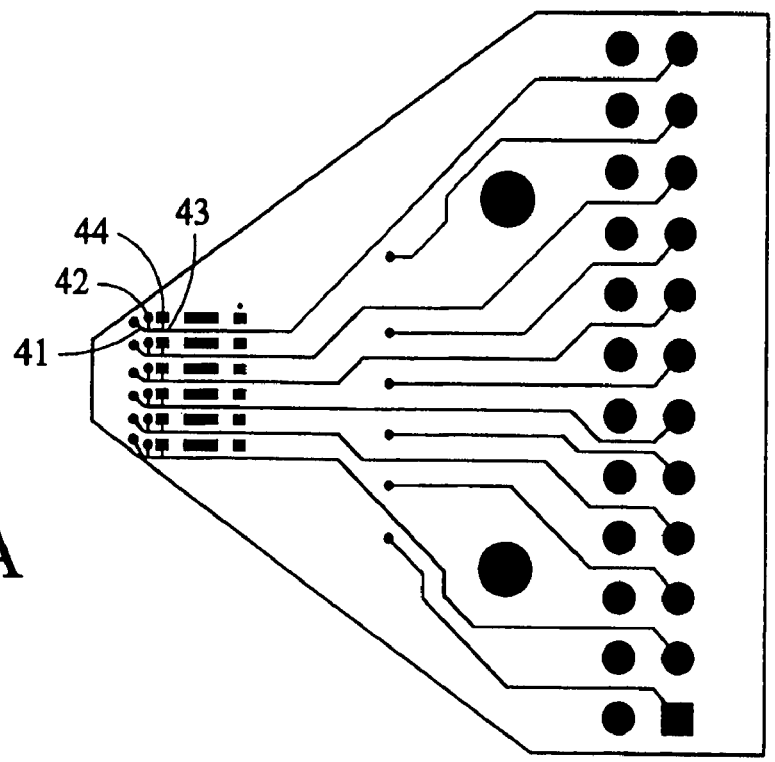
FIG. 4A shows a schematic of the electrical trace patterns of the top face of the exemplary probe head of FIG. 1 including a power bypass feature.
Figure 4B:
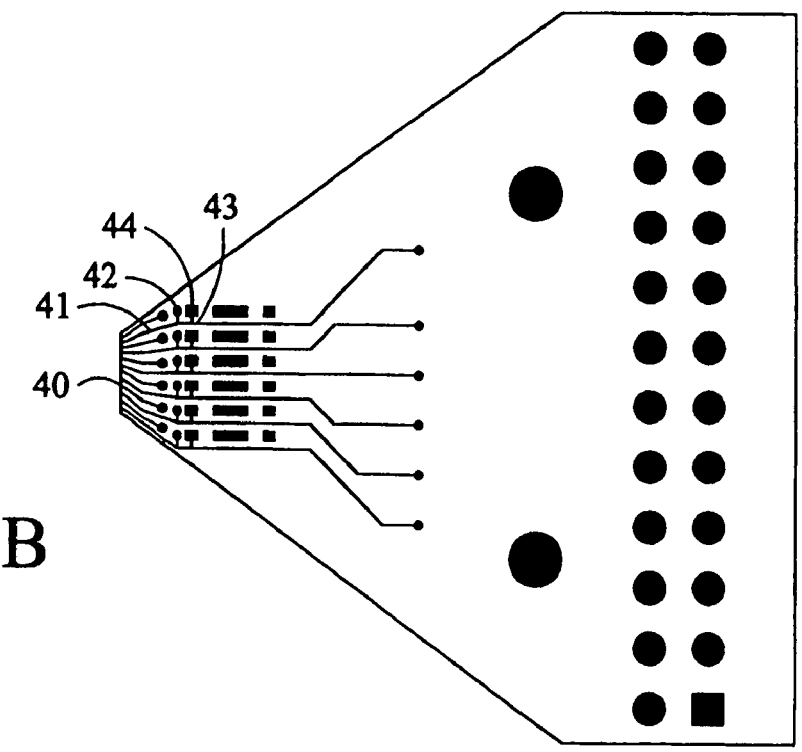
FIG. 4B shows a schematic of the electrical trace patterns of the bottom face of the exemplary probe head of FIG. 1 including a power bypass feature.

Referring to FIG. 1 and FIGS. 4A and 4B, the circuit board electrical traces 40 provide continued geometrical fanning to even larger dimensions, ultimately leading to one or more connectors such as the set of pins shown in FIG. 1, typically of a much larger physical scale. The circuit board 14 may have a ground plane (not shown) providing reduced ground inductance and controlled impedance of the signal traces 40—usually 50 ohms for use with standard test equipment. Use of a circuit board 14 also allows for the optional use of very small dimension Surface Mount Technology (SMT) components that can be placed at an intermediate level of geometric scaling.

As shown in FIG. 1 and FIG. 2, the structure is compatible with a power bypass architecture that can be mounted on the surface of the circuit board 14. In the preferred embodiment both surfaces of the circuit board are used to provide the power bypass feature in order to utilize the additional space.

To illustrate how such a power bypass structure may be incorporated, FIGS. 1 and 2 depict a power bypass architecture spread over both surfaces of the circuit board 14. It should be noted, however, that it is entirely feasible to provide a complete power bypass structure using only one surface of the circuit board if so desired. In this illustration, the four contact fingers 50, 52, 54, 56 are arranged in an adjacent relationship, alternating between power and ground contacts. On the bottom surface of the circuit board, depicted FIG. 2, a high frequency metal-insulator-metal (MIM) capacitor is attached between the adjacent power and ground transmission lines formed by respected pairs of contact fingers.

While the MIM capacitor has very low inductive parasitics and a very high self-resonant frequency it does not have very much capacitance. This limits its ability to provide power bypass at lower frequencies. Accordingly, a relatively larger sized and valued SMT capacitor, though still of very small physically dimension, is placed further up the board where there is sufficient space. A small value SMT resistor is used in series with this capacitor to "de-Q" or spoil the parallel resonance that can occur between the MIM capacitor and the inductance of the line length running to the SMT capacitor.

Referring specifically to FIGS. 4A and 4B, the circuit board is designed to allow customization of the function, i.e. ground, signal, power, etc., of each electrical contact of the probe. Initially, each of the fingers is connected to a via to the ground plane, to an SMT component and eventually to the connector. Programming a ground contact requires simply leaving the connection to the ground intact, while for all other functions this small circuit board trace is cut away, with a sharp blade or a laser for instance. When programming a bypassed power line the connection to the SMT component is left intact while the short circuit trace to the ground is cut.

Referring again to FIG. 1, the probe design preferably includes an inclined circuit board 14 relative to the device under test. A major portion of the fingers 16 are likewise preferably aligned with the plane of the circuit board 14 with the distal ends 18 being shaped for appropriate probing of the device under test. This inclined design permits the circuit board 14 to be spaced apart from the device under test during testing, while simultaneously permitting the fingers 16 to be short, which minimizes inductance to increase performance. Otherwise, the fingers would need to be mounted in an inclined manner with respect to the circuit board, which in many cases, would require longer fingers for effective probing.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method of assembling a probe comprising:
   (a) providing a substantially rigid support supporting a plurality of conductive traces;
   (b) providing a unitary assembly including a plurality of contact fingers, such that said plurality of contact fingers are maintained in a predetermined alignment and one end of at least one of said contact fingers is free of attachment to another of said contact fingers for a major portion of a length of said contact finger;
   (c) heating a portion of said major portion of said contact finger free of attachment to another contact finger to bond said contact finger to a trace on said support.

2. The method of claim 1 wherein a plurality of said contact fingers extend in a radially outward direction from said support.

3. The method of claim 2 wherein the arrangement of said contact fingers match the geometry of a contacting pad on a device under test.

4. The method of claim 1 wherein said support includes a resistor capacitor network interconnected to said contact fingers.

5. The method of claim 1 wherein said support is a planar circuit board.

6. The method of claim 1 wherein said unitary assembly includes a tab proximate the ends of said plurality of contact fingers that maintains said contact fingers in said predetermined alignment.

7. The method of claim 6 wherein said tab is removed prior to probing with said contact fingers.

* * * * *